United States Patent [19]

Taylor

[11] 4,190,345

[45] Feb. 26, 1980

[54] LITHOGRAPHIC PLATE PROCESSING APPARATUS

[75] Inventor: Alfred S. Taylor, Fortunes Rocks, Me.

[73] Assignee: Scott Paper Company, Philadelphia, Pa.

[21] Appl. No.: 924,653

[22] Filed: Jul. 14, 1978

[51] Int. Cl.² ............................................. G03D 5/04
[52] U.S. Cl. ................................... 354/318; 354/325; 118/117; 118/415
[58] Field of Search ............... 354/317, 318, 319, 323, 354/324, 325, 297; 118/110, 119, 412, 415, 304; 15/77

[56] References Cited

U.S. PATENT DOCUMENTS

| | | | |
|---|---|---|---|
| 3,528,358 | 9/1970 | Pickard | 354/317 |
| 3,589,261 | 6/1971 | Krikelis | 354/324 |
| 3,621,772 | 11/1971 | Bogue | 354/317 |
| 3,682,079 | 8/1972 | Casson | 354/318 |
| 3,694,142 | 9/1972 | Schuierer | 118/415 |
| 3,719,133 | 2/1972 | Haracz | 354/317 |
| 3,732,808 | 5/1973 | Graham | 354/318 |
| 3,903,541 | 9/1975 | Meister et al. | 354/317 |
| 3,906,536 | 9/1975 | Graham | 354/319 |
| 3,916,426 | 10/1975 | Bown | 354/325 |
| 3,936,853 | 2/1976 | Mart | 354/297 |
| 3,965,343 | 12/1976 | Horner | 354/297 |
| 3,983,758 | 11/1976 | Hovekamp | 354/297 |
| 4,001,854 | 1/1977 | Formoy | 354/318 |
| 4,081,815 | 3/1978 | Horner | 354/319 |
| 4,091,404 | 5/1978 | Schornig et al. | 354/325 |

FOREIGN PATENT DOCUMENTS

1381523  1/1975  United Kingdom ............... 354/317

*Primary Examiner*—L. T. Hix
*Assistant Examiner*—Alan Mathews
*Attorney, Agent, or Firm*—R. Duke Vickrey; John W. Kane, Jr.

[57] ABSTRACT

Disclosed is an improved lithographic plate processing apparatus which comprises means for moving an exposed lithographic plate through the apparatus on an uphill slope, developer means within the apparatus for applying a developer liquid to the plate as it moves through the apparatus, and gumming means within the apparatus for applying gum to the plate after it has been developed, the gumming means including a baffle member under which the plate passes in contact and which forms a dam to hold a puddle of gum on the plate and against the baffle member, and spray means for spraying the gum onto the plate, the improvement comprising, as part of the gumming means, a rotatable gumming scrub brush between the baffle member and the spray means and in a position to scrub the plate when it passes thereunder.

3 Claims, 1 Drawing Figure

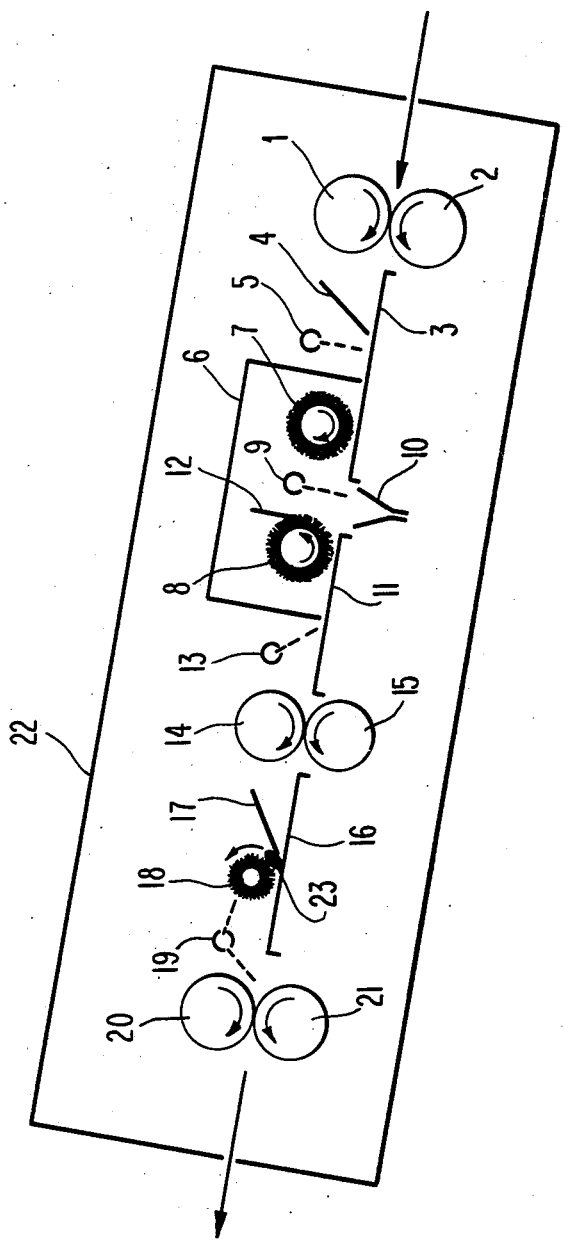

LITHOGRAPHIC PLATE PROCESSING APPARATUS

TECHNICAL FIELD

The present invention is an improved lithographic plate processing apparatus of the type which automatically develops and gums an exposed lithographic printing plate.

BACKGROUND ART

In the lithographic printing process, a lithographic plate comprising an aluminum sheet is initially coated with a photosensitive layer. A negative is applied over the photosensitive layer and the two are exposed to high intensity light, the negative is then removed, and the plate is processed to develop it. Although some manual developing is still done, the large scale commercial use of lithographic plates has made automatic processing of necessity. Numerous apparatus have been proposed to perform such processes. In general, the more successful machines have emulated the normal development procedures by subjecting the plate to a scrubbing action while flooding the plate with developer liquid and then flooding the plate with gum arabic. However, there has always been need to improve the apparatus to perform tasks more satisfactorily.

DISCLOSURE OF THE INVENTION

It is an object of the invention to provide an improved lithographic plate processing apparatus.

This and other objects are provided by the present invention, which is an improvement in a lithographic plate processing apparatus which comprises means for moving an exposed lithographic plate through the apparatus on an uphill slope, developer means within the apparatus for applying a developer liquid to the plate as it moves through the apparatus, and gumming means within the apparatus for applying gum arabic or other plate finisher to the plate after it has been developed, the gumming means including a baffle member under which the plate passes in contact and which forms a dam to hold a puddle of gum on the plate and against the baffle member, and spray means for spraying the gum onto the plate. The improvement comprises, as part of the gumming means, a rotatable gumming scrub brush between the baffle member and the sprays means and in a position to scrub the plate when it passes thereunder.

BRIEF DESCRIPTION OF THE DRAWINGS

The drawing is a cut-away side view of the apparatus of the present invention illustrated schematically.

BEST MODE FOR CARRYING OUT THE INVENTION

Referring to the drawing, the path of an exposed lithographic plate passing through the apparatus on a slight uphill slope is illustrated by the arrows. The plate is first gripped by a pair of rotating rubber covered feed rolls 1 and 2 and fed into the apparatus, where it slides over a support member 3 and under a flexible baffle member 4. Baffle member 4 acts as a seal to prevent developer fluid from draining back onto the pair of feed rolls 1 and 2.

Immediately beyond baffle member 4, the plate passes under a spray bar 5, extending across the width of the plate, which sprays developer liquid onto the exposed surface of the plate. The plate then passes under a small opening into an enclosure 6 where the plate is scrubbed by rotating brushes 7 and 8. The first brush 7 is a hard bristle brush and rotates in the direction of plate movement to provide adequate brushing pressure without catching the forward edge of the plate. The second brush 8 is a soft bristle brush and rotates against the travel of the plate to provide a final cleaning station beyond which the "dirty" developer is not allowed to flow. This brush 8 has a doctor blade 12 to prevent dirty developer from being thrown forward.

Above the plate and between brushes 7 and 8 is a second developer liquid spray bar 9 extending across the width of the plate and providing fresh developer. A drain 10 is located beneath the path of travel of the plate and between brushes 7 and 8. Dirty developer fluid passes through drain 10 and is recirculated through filters (not shown). After passing under brush 8, the plate slides along support member 11, passing through an opening in enclosure 6, and into the second pair of rotating rubber covered feed rolls 14 and 15. A disposable plush wiper member (not shown) is preferably positioned against feed roll 14 to maintain the roll in a clean condition. Just beyond the enclosure 6 is a spray nozzle 13 which applies a final applicaton of fresh developer liquid to clean the plate.

The second pair of feed rolls 14 and 15 feed the plate into the gumming section where it passes over a support plate 16 and beneath a flexible baffle member 17. The baffle member 17 forms a seal to prevent the gum from flowing from the gumming section of the apparatus back against the second pair of feed rolls 14 and 15 or into the developing section. It also forms a dam against which a puddle of gum 23 forms to assure overall coverage of the plate. Just beyond baffle member 17 the plate passes under a rotating nylon bristle brush roll which rotates in a direction against the movement of the plate.

The gum is applied by spray bar 19 extending across the width of the plate and spraying at the downstream end of the gumming section and onto the brush roll 18 to keep it wet with gum. The gum is sprayed on the downstream end of the gumming section to allow maximum contact time with the plate.

After gumming, the plate is fed into a third pair of rubber feed rolls 20 and 21 which push the plate from the apparatus. The apparatus includes an enclosure cover 22 to prevent loss of the developer liquid and gum arabic. A drying section may be added, if desired, to the end of the gumming section.

The feed rolls 1, 2, 14, 15, 20, and 21 and the developer scrub brushes 7 and 8, and the gumming brush 18 are all driven by either chain and sprocket or belt drive means (not shown). The pairs of feed rolls are spaced apart a distance less than the length of the plate so that one pair grips the plate before the preceding pair releases it. The uphill slope of the path of travel of the plate is preferably about 5°.

What is claimed is:

1. In a lithographic plate processing apparatus which comprises means for moving an exposed lithographic plate through the apparatus on an uphill slope, developer means within the apparatus for applying a developer liquid to the plate as it moves through the apparatus, and gumming means within the apparatus for applying gum to the plate after it has been developed, the gumming means including a baffle member under which the plate passes in contact to enter the gumming means and which forms a dam to hold a puddle of gum on the plate and against the baffle member, and spray means for spraying the gum onto the plate at the downstream end of the gumming means whereby the gum flows downhill over the upwardly moving plate, the improvement comprising, as part of the gumming means, a rotatable gumming scrub brush between the baffle member and the spray means and in a position to scrub the plate when it passes thereunder after passing through the puddle of gum and before passing the spray means:

2. The lithographic plate processing apparatus of claim 1, wherein the gumming scrub brush rotates against the plate only in a direction against the movement of the plate.

3. The lithographic plate processing apparatus of claim 2, wherein the spray means also sprays gum onto the gumming scrub brush.